United States Patent [19]

Beha

[11] Patent Number: 5,448,162
[45] Date of Patent: Sep. 5, 1995

[54] INSTRUMENT FOR TESTING AND/OR MEASURING ELECTRIC MAGNITUDES

[76] Inventor: Christian Beha, Fohrentalstrasse 6a, D-79286 Glottertal, Germany

[21] Appl. No.: 247,274

[22] Filed: May 23, 1994

[30] Foreign Application Priority Data

Jun. 14, 1993 [DE] Germany ............... 43 19 643.8

[51] Int. Cl.6 .............................. G01R 1/04
[52] U.S. Cl. .................... 324/72.5; 324/149; 324/156; 324/114; 73/431; 439/482
[58] Field of Search .......... 73/431; 324/725, 149, 324/156, 114; 439/482

[56] References Cited

U.S. PATENT DOCUMENTS 2,778,992  1/1957  McFarland ............... 324/51
2,783,445  2/1957  Cahn ..................... 339/262
4,238,728 12/1980  Wells, Jr. et al. ......... 324/149

FOREIGN PATENT DOCUMENTS 3513345 10/1986 Germany.
8909511 10/1989 Germany.
2236629 10/1991 United Kingdom.

OTHER PUBLICATIONS

Patent Abstracts of Japan vol. 7, No. 51 Feb. 1983.

Primary Examiner—Kenneth A. Wieder
Assistant Examiner—Mark Wardas
Attorney, Agent, or Firm—Haynes N. Johnson

[57] ABSTRACT

The invention relates to an instrument for testing and/or measuring electric magnitudes, in particular voltages and/or resistances. The instrument consists of two handle parts (10, 12), which are connected by a flexible cable (14), and which each have a contact point (16, 18). In addition to the contact point (16, 18), the handle parts (10, 12) each have a receptacle for the contact point (18, 16) of the other handle part (12, 10). The handle parts (10, 12) can be plugged together in such a way that their contact points (16, 18) each are pluggable into the receptacle of the other handle part (12, 10) nonparallel with the contact point (18, 16) of such other handle part. The contact point (16) and the receptacle of the one handle part (10) are arranged in a down-folding point part (22), so that the instrument, in the plugged-together condition, can be folded together for convenient, safe and space-saving storage.

9 Claims, 6 Drawing Sheets

INSTRUMENT FOR TESTING AND/OR MEASURING ELECTRIC MAGNITUDES

The invention relates to an instrument for testing and/or measuring electric magnitudes, in particular voltages and/or resistances, according to the introductory part of claim 1.

Instruments of said type are preferably used as voltage and/or continuity testers in connection with the installation, maintenance and repair of electrical installations and equipment. The two contact points are contacted with the electric poles, cores, connections or components, between which the voltage, the resistance or the continuity is to be tested or measured. The electronic testing and measuring circuit indicating elements, and, if need be, the voltage supply of the instrument are arranged in the parts of the handle, preferably in one part of the handle, which is designed as a housing for such arrangement.

Instruments of said type are frequently carried along for installation and repair work outside the workshop. If the instruments are carried along in a tool bag or box, only little inconvenience is caused by the contact points, which freely project from the parts of the handle. However, if the instruments are carried along in a pocket of the garment, in a belt bag, or in a belt loop, the freely projecting contact points are troublesome to the user, and even pose the risk of injury. Furthermore, the contact points can be damaged.

The invention is based on the problem of making available an instrument of the type specified above that can be carried along by the user without the contact points being in the way, causing any risk of injury, or getting damaged.

According to the invention, said problem is solved by an instrument with the features of claim 1.

Advantageous embodiments of the invention are specified in the dependent claims.

In each of its handle parts, the instrument has—in addition to the contact point—a receptacle, into which the contact point of the other part of the handle can be plugged when the instrument is not in use. In such plugged-together condition, each one of the contact points is protected by the handle part of the other contact point. Therefore, the user no longer comes into contact with the contact points, so that the latter are not troublesome to the user and cannot cause any injury to the latter, or damage to garments; furthermore, there is no risk that the contact points are bent, broken off, or damaged in some other way. The contact points can be locked in the associated receptacles by friction grip. Usefully, however, the contact points and receptacles are designed with an arresting device, so that the contact points are snap-locked when they are plugged together, and any unintended separation is reliably prevented.

If the two parts of the handle are plugged together with their contact points arranged in nonparallel positions, the lengths of the two parts of the handle add up when the instrument is plugged together. This may make the plugged-together instrument unhandy. Therefore, in a preferred embodiment, one of the parts of the handle is designed with a swinging point part, with the contact point and the receptacle being arranged on said part. With this design, the instruments with the contact points plugged into one another can be folded together, so that the instrument is compact when not in use, and it can be stored in a space-saving way. In particular, when it is folded together, the instrument can be easily pushed into a garment or belt pocket.

So that the unfoldable point part will not swing when the instrument is used, provision is usefully made for an arresting device that arrests the point part at least in the operating position. Such arrest can be designed in the form of a force-locking arresting device, for example with spring-loaded arrest balls, so that the point part can be folded down while overcoming the arresting force, or in the form of a form-locked arrest that retains the point part in the unfolded operating position in a form-locked way. In an embodiment that is advantageous for easy handling, the form-locked arrest can be released when the contact point of the other part of the handle is plugged in, so that the instrument can be folded together as soon as the parts of the handle with their contact points are plugged together.

The invention is explained in greater detail in the following by reference to an exemplified embodiment shown in the drawing, in which.

Figure 1:
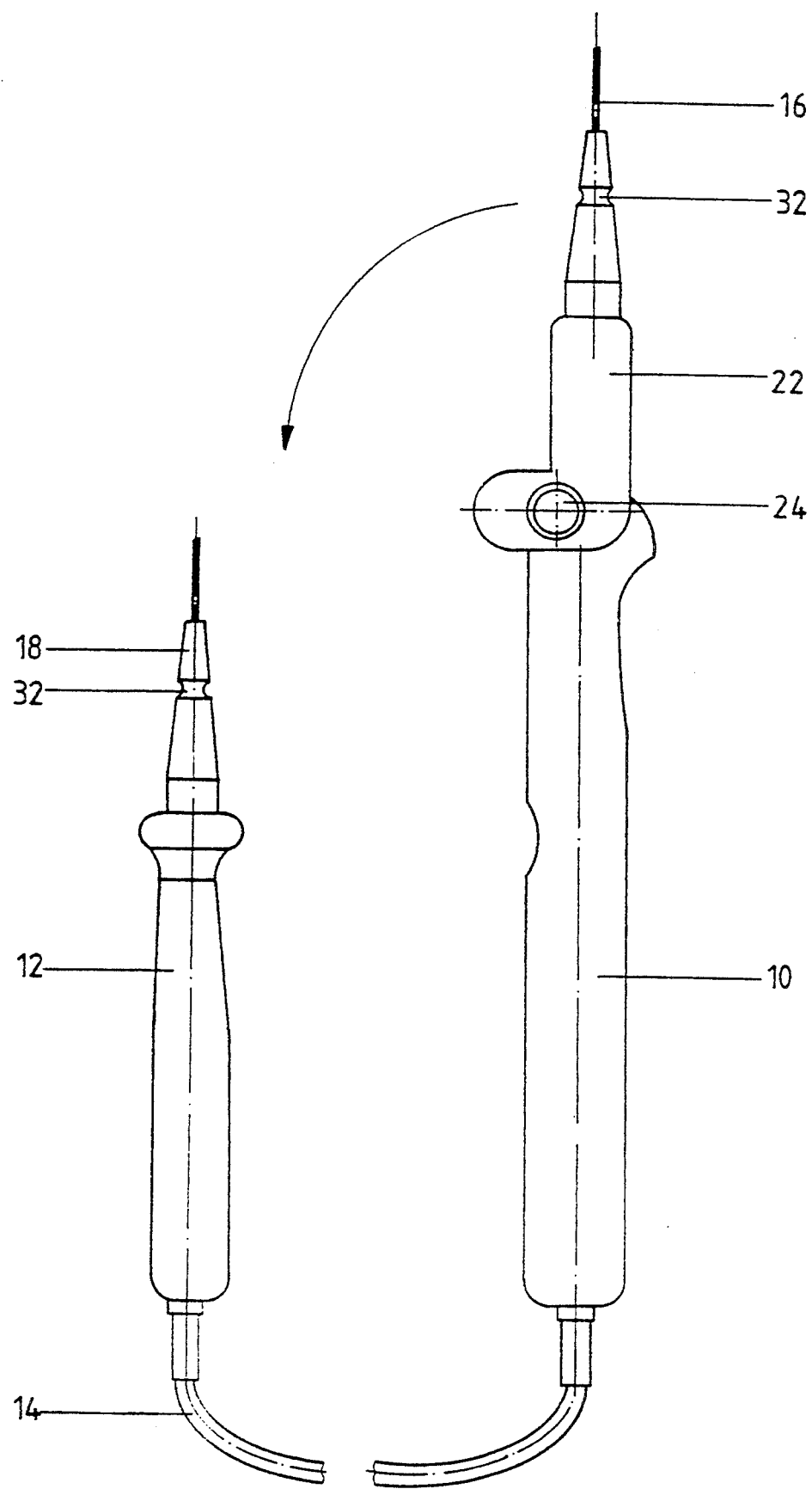
FIG. 1 shows a lateral view of the instrument in the operating position.

The instrument, which, for example, is suitable as a voltage and continuity tester, has a first handle part 10 and a second handle part 12, said parts being connected with each other by a flexible cable 14. The first handle part 10 has a contact point 16, and the second handle part 12 has a contact point 18. The first handle part 10 is designed as a housing, which receives the electronic circuit for measuring and testing the voltage or the continuity; the indicating and actuating elements 20; and a supply battery. The first contact point 16 is connected with the circuit in the first handle part 10, said circuit being accommodated in said part 10, and the second contact point 18 is connected to said circuit via the cable 14. To this extent, the instrument is designed in the manner known per se. Particularly the type of measuring and/or testing and the circuit used for such purposes are known per se and not the object of the invention, so that their details need not to be described.

Figure 3:
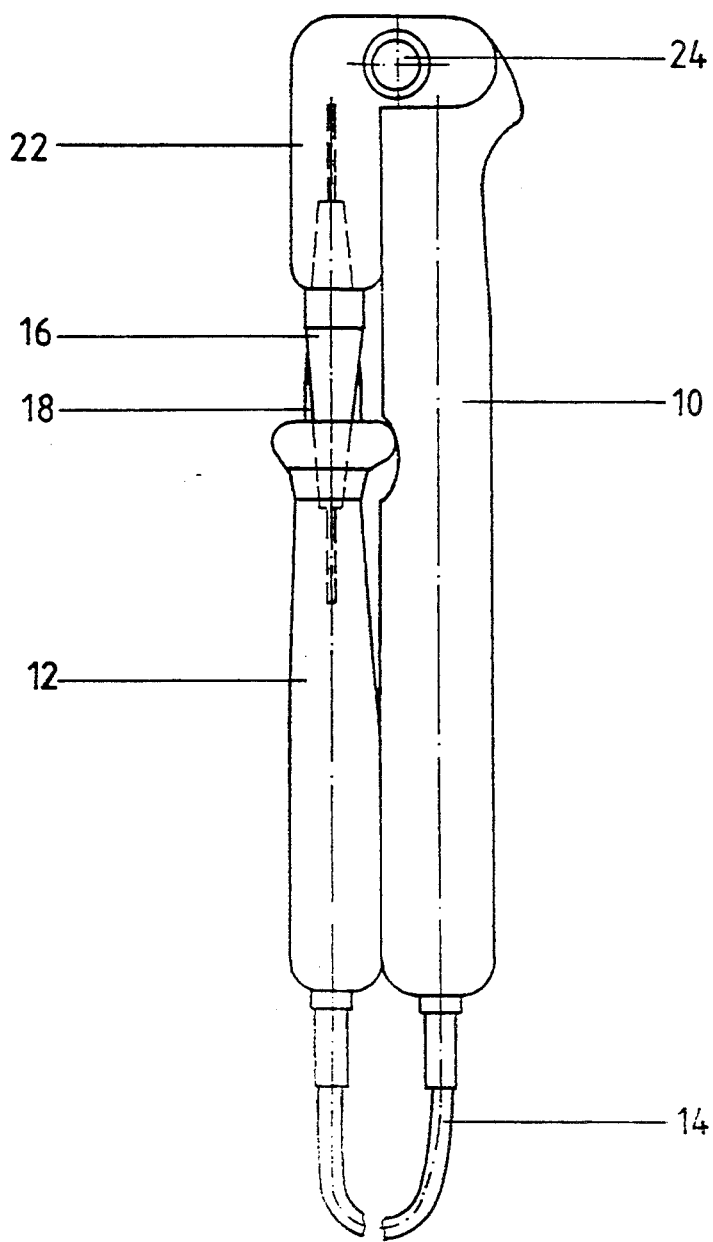
FIG. 3 shows a lateral view of the instrument in the folded-together condition.

At its end opposite the connection of the cable 14, the first handle part 10 has a point part 22, which is swinging around a joint 24 against the first handle part 10. The swing axle 56 of the joint 24 extends transversely to the longitudinal expanse of the first handle part 10. By means of the joint 24, the point part 22 can be unfolded into an operating position shown in FIG. 1, in which the point part 22 is arranged in a straight-line extension of the handle part 10. From said operating position, the point part 22 can be folded down by 180°—as indicated by the arrow in FIG. 1—into a resting position, which is shown in FIG. 3. In the resting position, the point part 22 rests against the flat side of the handle part 10. The electrical connection of the contact point 16—the latter being arranged in the swinging point part 22—with the circuit arranged in the handle part 10 is made via a flexible core, a slide contact or the like.

Figure 2:
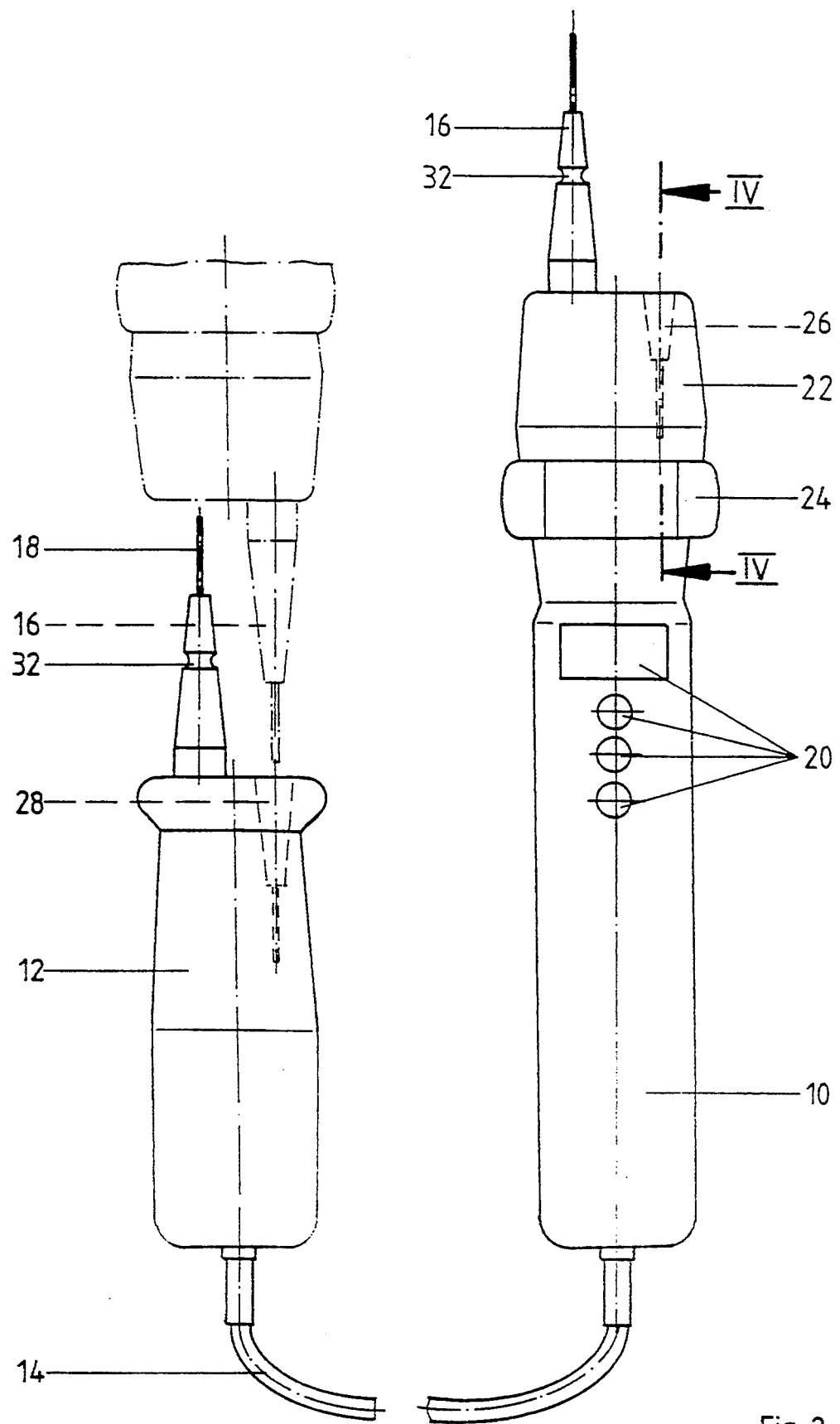
FIG. 2 shows a front view of the instrument.

The first contact point 16 is asymmetrically arranged in the face of the point part 22, said face being disposed opposite the joint 24. In the same way, the second contact point 18 is asymmetrically arranged in the face of the second handle part 12, said face being disposed opposite the connection of the cable 14. Next to the first contact point 16, provision is made in the face of the point part 22 for a first receptacle 26, the latter being axially parallel with said contact point 16. Accordingly, provision is made in the face of the second handle part 12 for a second receptacle 28 disposed next to the contact point 18 and axially parallel with said second handle part 12. The second receptacle 28 has a shape conforming to the first contact point 16, whereas the first receptacle 26 has a shape conforming to the second contact point 18. The receptacles 26 and 28 are arranged next to the contact points 16 and 18, respectively, with a spacing such that the first contact point 16 of the first handle part 10 penetrates the second receptacle 18 of the second handle part 12, and the second contact point 18 of the second handle part 12 penetrates the first receptacle 26 of the first handle part 10 when the two handle parts 10 and 12 are plugged together with the contact points 16 and 18 directed nonparallel against each other, as indicated dash-dotted in FIG. 2.

Preferably, the contact points 16 and 18 and the receptacles 26 and 28 have an arresting device for retaining the contact points 16 and 18 force-locked in the receptacles 26 and 28, respectively, said points being plugged into said receptacles. For example, the arresting device can be a spring-loaded ball 30, as shown in FIG. 4 for the first receptacle 26, said ball engaging a matching arresting groove 32 of the contact points 16 and 18.

In the operating position shown in FIG. 1, the point part 22 is arrested in its position aligned with the first handle part 10, so that it cannot swing against the first handle part 10 even when loaded during use. For this purpose serves, on the one hand, a stop 34 molded on the first handle part 10, which stop prevents the point part 22 from swinging beyond the extended position of FIG. 1. On the other hand, the arresting device has an arrest configuration preventing the point part 22 from folding down from the extended position of FIG. 1.

Figure 4:
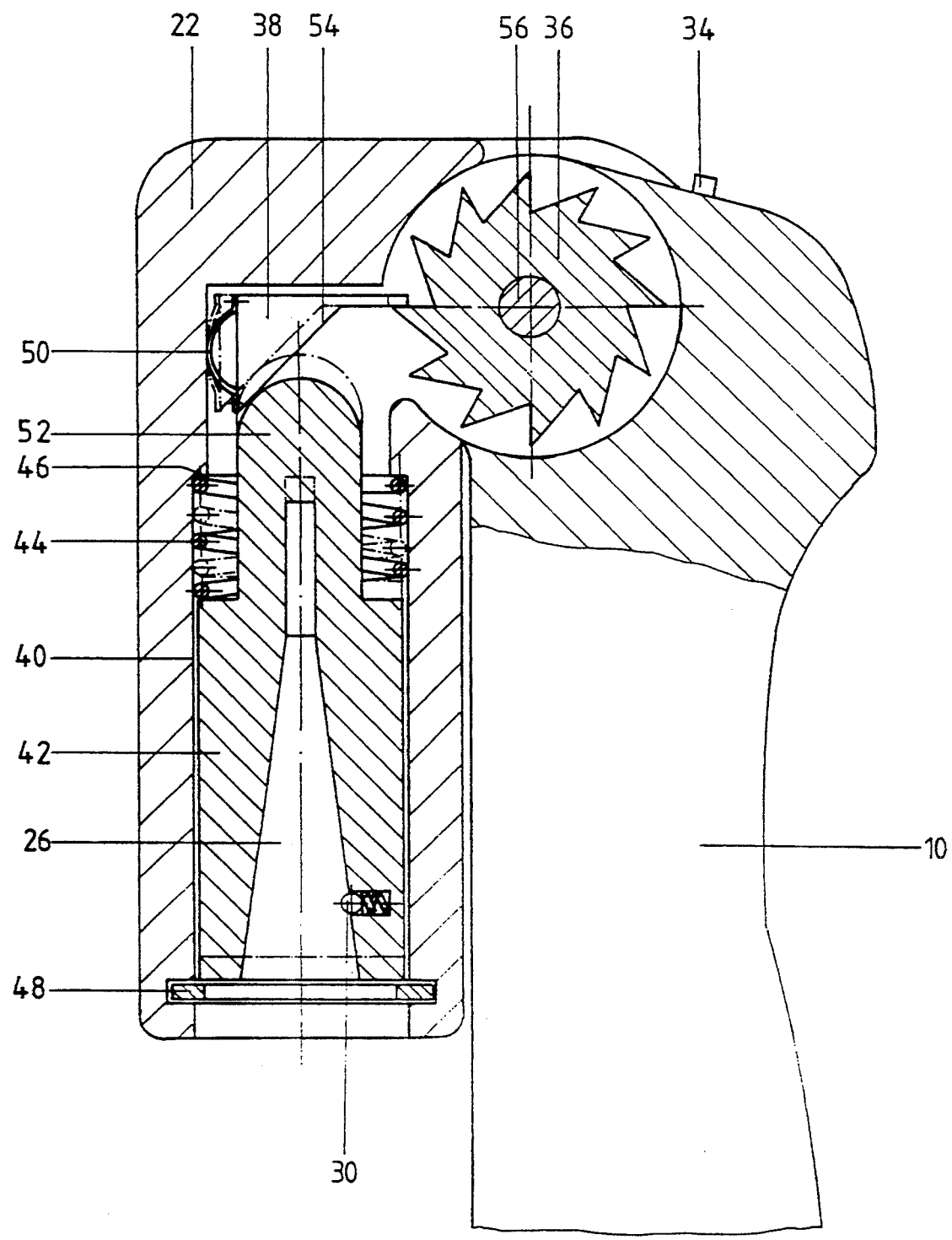
FIG. 4 shows a first design of the arresting device, with a section according to line IV—IV in FIG. 2 shown enlarged.

In an exemplified embodiment shown in FIG. 4, the aresting device is designed in the form of a form-locked arrest. The latter has a locking wheel 36, which is arranged fixed in the first handle part 10 and coaxially with the joint 24, and a locking wedge supported in the point part 22. The point part 22 has a blind hole in its face, in which a sliding sleeve 42 is guided with axial displaceability. The first receptacle 26 is formed in the sliding sleeve. By means of a spiral pressure spring 44, which supports itself on an inside shoulder 46 of the blind hole, the sliding sleeve 42 is kept resting against a spring ring 48 inserted in the blind hole 40. The sliding sleeve 42 can be forced inwardly into the blind hole 40 against the force of the spiral pressure spring.

The locking wedge 38 is seated on the inside bottom of the blind hole 40 and is displaceable transversely to the axis of the blind hole 40. A spring leaf 50 mounted on the locking wedge 38 supports itself on the inside wall of the blind hole 40 and forces the locking wedge 38 through a wall breakthrough of the blind hole 40, so that said wedge engages the toothing of the locking wheel 36. A pushrod 52 is molded on the inside end of the sliding sleeve 42, said pushrod engaging a bevel 54 of the locking wedge 38. The bevel 54 has an angle of gradient of less than 45° against the axis of the sliding sleeve 42 and ascends from the end engaging in the locking wheel 36 to the end of the locking wedge 38 fitted with the spring leaf 50. The toothing of the locking wheel 36 is designed as a ratchet toothing, i.e., the teeth of the locking wheel have a flank rising at a small angle, and a radially extending tooth flank.

In the resting position shown in FIG. 4, the sliding sleeve 42 receiving the second contact point 18 of the second handle part 12 is kept resting against the spring ring 48 by the spiral pressure spring 44. The spring leaf 50 presses the locking wedge 38 into the locking wheel 36, so that the point part 22 is maintained in the position shown in FIG. 4. The contact points 16 and 18 are kept in the respective receptacles 26 and 28 by means of the arresting devices of the ball 30 and the arresting grooves 32. Thus the instrument is locked in the folded-together position shown in FIG. 3 and can be transported in a safe, convenient and space-saving way.

When the instrument is to be used, the second handle part 12 is swung away from the first handle part 10 and, via the contact points 16 and 18 plugged into the receptacles 26 and 28, respectively, takes along the point part 22, which thus is swung clockwise (in FIG. 4) against the first handle part 10. During such swinging motion, the locking wedge 38 can slide across the flatly rising tooth flanks of the locking wheel 36 against the force of the spring leaf 50. Once the point part 22 has reached the extended operating position, any further swinging of the point part 22 is prevented by the stop 34. The locking wedge 38, under the force of the spring leaf 50, engages behind the tooth of the locking wheel 36 which, in FIG. 4, in arranged diametrally opposite the locking wedge 38. The radial tooth flank of the locking wheel 36 now cooperates with the locking wedge 38 and, in a form-locked way, prevents the point part 22 from swinging back counterclockwise. The second handle part 12 can now be pulled from the first handle part 10 against the arresting effect of the ball 30 and the arresting grooves 32, so that the instrument is ready for use.

When the instrument is to be changed again to its resting position, the contact points 16 and 18 are again inserted in the receptacles 26 and 28. For this, an axial pressure is applied to the sliding sleeve 42 with the second contact point 18 of the second handle part 12, said contact point being seated in the first receptacle 26. In this way, the sliding sleeve 42 is pushed inwardly in the blind hole 40 against the force of the spiral pressure spring 44, and, with its pushrod 52, applies pressure to the bevel 54 of the locking wedge 38. The latter is displaced against the force of its spring leaf 50 and disengaged from the toothing of the locking wheel 36. The arrest of the point part 22 is thus released and the point part 22 with the inserted second handle part 12 can be folded into the resting position shown in FIG. 3. In such resting position, no further pressure is applied to the sliding sleeve 42; the latter is again pushed against the spring ring 48 by the spiral pressure spring 44, and the spring leaf 50 pushes the locking wedge 38 again into engagement with the locking wheel 36.

Figure 5:
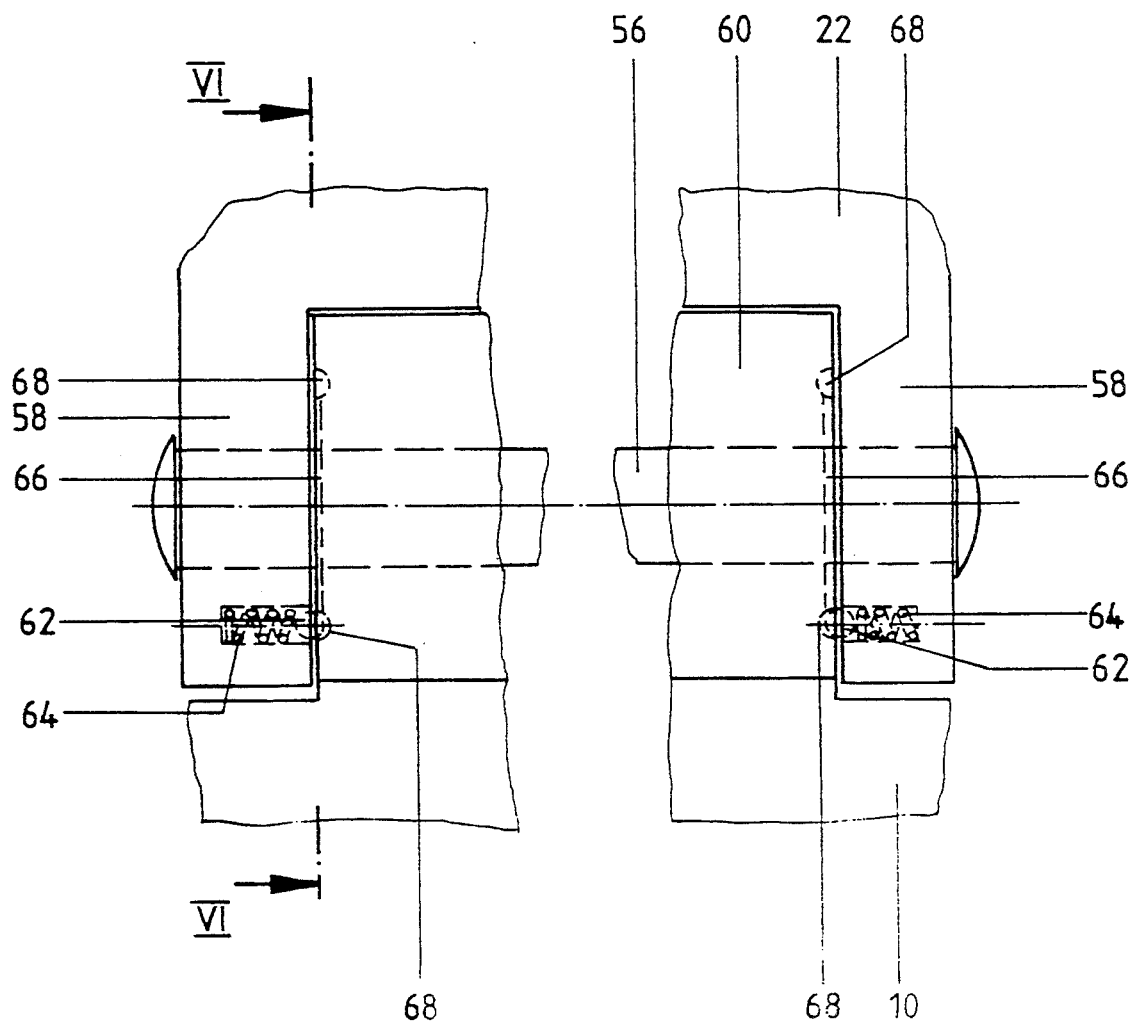
FIG. 5 shows a partial view—conforming to FIG. 2—of a second design of the arresting device.
Figure 6:
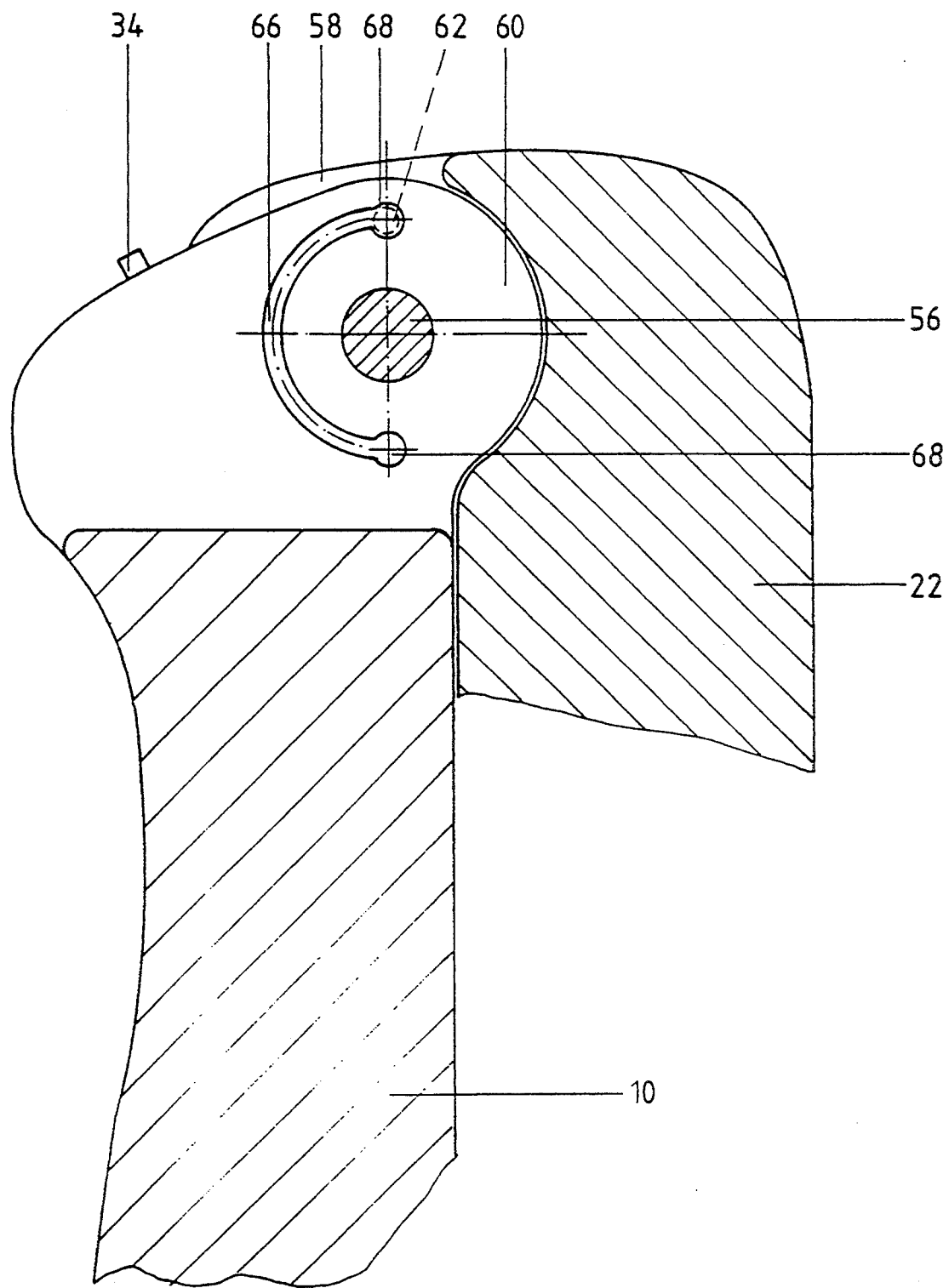
FIG. 6 shows a section according to line VI—VI in FIG. 5.

FIGS. 5 and 6 show a second embodiment of the arresting device, for which provision is made for a substantially force-locking arrest. For this purpose, the first handle part 10 and the point part 22 are fitted with a spring-loaded arresting member and matching arrest receptacles. The arresting member engages arrest receptacles associated with the folded-together resting position and the unfolded, extended operating condition.

In the exemplified embodiment shown, the joint 24, which connects the point part 22 with the handle part 10, is designed symmetrically, whereby the point part 22, with the projecting joint attachments 58, grips on both sides around a joint attachment 60 of the handle part. The joint attachments 58 of the point part 22 and the joint attachment 60 of the handle part 10 rest against each other in each case with axial faces, which extend perpendicular to the swing axle 56 and are penetrated by the latter in the center. An arresting ball 62 is supported in each of the joint attachments 58 of the point part 22, said ball being acted upon by a pressure spring 64 and projecting from the axial face. In each case, the arresting balls 62 are arranged eccentrically relative to the swing axle 56. In each of the two axial faces of the joint attachment 60 of the handle part 10, provision is made for a running groove 66 for the associated arresting ball 62. The running grooves 66 extend across a semicircle, of which the radius based on the swing axle 56 conforms to the radius of the arresting balls 62. Provision is made for a deepened arrest receptacle 68 at each of the two ends of the running groove 66. The angular arrangement of the arresting balls 62 in the point part 22 and of the running groove 66 with the arrest receptacles 68 in the handle part 10 is selected in such a way that in the folded-together resting condition, the arresting balls 62 engage one arrest receptacle (as shown in FIG. 6) under the pressure of the spring 64, whereas in the unfolded, extended operating condition, said balls engage the other arrest receptacle 68, as shown in FIG. 5.

Thus the point part 22 is arrested by the engaging arresting balls 62 in the folded-together resting and in the unfolded operating conditions. For unfolding the instrument or for folding it together, the point part 22 has to be swung against the handle part 10 with a force such that the arresting balls 62 are forced from the arrest receptacles 68 against the force of the springs 64. When the point part 22 is swung, the arresting balls 62 run in the running grooves 66.

I claim:

1. Instrument for testing and measuring of electric magnitudes, in particular voltages and resistances, with two handle parts connected with each other via a flexible cable, each of said parts having a contact point, characterized in that each of the handle parts (10 and 12) has a receptacle (26 and 28, respectively) for the contact point (18 and 16, respectively) of the other handle part (12 and 10, respectively), said handle part (10) being swivel-mounted and swinging around an axle (24) extending transversely the handle part (10) whereby the receptacles (26 and 28, respectively) are arranged next to the contact points (16 and 18, respectively) in a way such that the contact point (16 or 18) of the one handle part (10 or 12) is pluggable into the receptacle (28 or 26) of the other handle part (12 or 10) direct against the contact point (18 or 16) of the other handle part.

2. Instrument according to claim 1, characterized in that at least one of the contact points (16 or 18) is lockable (30, 32) in its associated receptable (28 or 26).

3. Instrument according to claim 2, characterized in that the swinging point part (22) has an unfolded operating position and is lockable on the handle part (10) at least in said unfolded operating position.

4. Instrument according to claim 3, characterized in that the arresting device has a releasable, form-locked arrest (36, 38).

5. Instrument according to claim 4, characterized in that the form-locked arrest (36, 38) is releasable by the inserted contact point (18) of the other handle part (12).

6. Instrument according to claim 5, characterized in that a locking wheel (36) is arranged in the handle part (10); that a locking element (38) engaging the locking wheel (36) is arranged in the point part (22); and that the locking element (38) is lifted from the locking wheel (36) by the contact point (18) of the other handle part (12).

7. Instrument according to claim 6, characterized in that the locking element is a locking wedge (38) with a bevel (54); that the receptacle (26) of the point part (22) is formed in a sliding sleeve (42) displaceably supported in the point part (22); and that the sliding sleeve (42) is displaceable by the inserted contact point (18) and, during its displacement, acts upon the bevel (54) and lifts the locking wedge (38) from the locking wheel (36).

8. Instrument according to claim 3, characterized in that the arresting device has a force-locking arrest (62, 68).

9. Instrument according to claim 8, characterized in that the force-locking arrest has at least one spring-loaded arresting member (62, 64) in the point part (22) or handle part (10), said member engaging a matching arrest receptacle (68) of the handle part (10) or point part (22) at least in the unfolded operating position.

* * * * *